US012600621B2

(12) United States Patent
Quartiroli et al.

(10) Patent No.: US 12,600,621 B2
(45) Date of Patent: Apr. 14, 2026

(54) SENSOR DEVICE AND RELATED METHOD AND SYSTEM

(71) Applicant: STMICROELECTRONICS S.r.l., Agrate Brianza (IT)

(72) Inventors: Matteo Quartiroli, Broni (IT); Alessandro Mecchia, Vimercate (IT); Laura Maestri, Pavia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 968 days.

(21) Appl. No.: 17/707,454

(22) Filed: Mar. 29, 2022

(65) Prior Publication Data

US 2022/0315416 A1     Oct. 6, 2022

(30) Foreign Application Priority Data

Mar. 31, 2021     (IT) ........................ 102021000007982

(51) Int. Cl.
B81B 7/02          (2006.01)
G01D 5/244        (2006.01)

(52) U.S. Cl.
CPC ........... B81B 7/02 (2013.01); G01D 5/24419 (2013.01); B81B 2201/02 (2013.01)

(58) Field of Classification Search
CPC .... B81B 7/02; B81B 2201/02; G01D 5/24419
(Continued)

(56) References Cited

U.S. PATENT DOCUMENTS

| | | | |
|---|---|---|---|
| 5,892,694 A | 4/1999 | Ott | |
| 5,982,305 A | 11/1999 | Taylor | |

(Continued)

FOREIGN PATENT DOCUMENTS

| | | |
|---|---|---|
| CN | 106849904 A | 6/2017 |
| CN | 107040486 A | 8/2017 |
| KR | 100879971 B1 | 1/2009 |

OTHER PUBLICATIONS

Ang et al., "Virtex FPGA Implementation of a Polyphase Filter for Sample Rate Conversion," *Conference Record of the Thirty-Fourth Asilomar Conference on Signals, Systems and Computers*, vol. 1, Piscataway, New Jersey, Oct. 29-Nov. 1, 2000, pp. 365-369.
(Continued)

*Primary Examiner* — Aditya S Bhat
(74) *Attorney, Agent, or Firm* — Seed IP Law Group LLP

(57)          ABSTRACT
The sensor is configured to provide a digital output signal and has a digital detector, which is configured to detect a physical quantity and generate a conditioned digital signal indicative of the detected physical quantity; and a rate modification stage, configured to receive the conditioned digital signal and a group of parameters, the group of parameters comprising an interpolation factor and a down-sampling factor, and to provide the digital output signal. The rate modification stage has an interpolator and a decimation element. The interpolator is configured to receive and to upsample the conditioned digital signal based on the inter-polation factor and to provide an interpolated signal. The decimation element is configured to downsample the inter-polated signal based on the downsampling factor, thereby generating the digital output signal.

22 Claims, 4 Drawing Sheets

(58) Field of Classification Search
USPC .......................................................... 702/120
See application file for complete search history.

(56) References Cited

U.S. PATENT DOCUMENTS

| | | | |
|---|---|---|---|
| 6,137,349 A | 10/2000 | Menkhoff et al. | |
| 6,341,048 B1 | 1/2002 | Morris et al. | |
| 8,050,934 B2 * | 11/2011 | Sakurai ................... | G10L 21/04 |
| | | | 704/503 |
| 2006/0033936 A1 | 2/2006 | Lee et al. | |
| 2006/0273938 A1 | 12/2006 | Van Den Enden et al. | |
| 2016/0252651 A1 | 9/2016 | Ellmauthaler et al. | |
| 2020/0186448 A1 * | 6/2020 | Avantaggiati ...... | H03H 17/0628 |

OTHER PUBLICATIONS

Yin-tang, et al., "Decimation filter design for 14-bit 1.28MS s sigma-delta ADC," Journal of Xidian University, vol. 37, No. 2, Apr. 2010, 5 pages.
"An apparatus and a method for analysing the condition for a machine," S.P.M. Instrument AB, Sweden, 90 pages.

* cited by examiner

SENSOR DEVICE AND RELATED METHOD AND SYSTEM

CROSS REFERENCE TO RELATED APPLICATIONS

This application claims the benefit of priority of Italian Application No. 102021000007982, filed on Mar. 31, 2021.

BACKGROUND

Technical Field

The present disclosure relates to a sensor, for example, to a sensor made using MEMS ("Micro Electro-Mechanical Systems") technology.

Description of the Related Art

As known, electronic apparatuses are popular, used for example both in the consumer electronics field and in the industrial and automotive fields, which incorporate one or more sensors configured to each detect one or more physical quantities associated with the use of the respective electronic apparatus.

For example, the one or more sensors may be accelerometers, gyroscopes, temperature, pressure, electrical resistance, mechanical stress, strain sensors.

It is also known to make such sensors using MEMS technology, which allows sensors having small dimensions, low energy consumption and high detection accuracy to be obtained.

A MEMS sensor is configured to convert a physical quantity into an electrical signal, of analog type, whose trend over time is a function of the trend over time of the respective detected physical quantity.

It is known to design an electronic apparatus incorporating the MEMS sensor so that the analog signal generated by the MEMS sensor is, in sequence, processed by an analog front-end, for example is amplified; converted into a digital signal using a sampling frequency $f_s$; and filtered by a filtering stage, for example by a low-pass filter, thus obtaining an output signal from the MEMS sensor having a sample frequency equal to the sampling frequency $f_s$.

The analog front-end, the sampling frequency $f_s$ and the subsequent filtering allow the output signal to meet a set of technical requirements of the MEMS sensor and of the electronic apparatus incorporating the MEMS sensor. For example, the sampling frequency $f_s$ may be chosen so to comply with the Nyquist sampling theorem relating to the band of the analog signal output by the MEMS sensor, and the filtering is such that it suppresses noise and/or possible demodulation tones generated at output by the analog-to-digital converter.

Furthermore, if the MEMS sensor comprises a mechanical oscillator, the output data rate from the MEMS sensor is determined by the operating frequency at which the mechanical oscillator is actuated.

As a result, the output data rate from the known MEMS sensor has a low level of personalization.

In order to increase the range of available values of the output data rate, it is known to incorporate a phase-locked loop (PLL) into the electronic apparatus. However, the output data rate is only changeable within the range of frequencies available in the oscillator used to obtain the PLL circuit. Furthermore, the PLL circuit has a high consumption of die area and energy and, in specific applications, meeting the desired design requirements is not always possible.

Alternatively, if the MEMS sensor comprises an electronic oscillator such as a clock, methods for trimming an oscillation frequency of the electronic oscillator are known, which also allow the output data rate from the MEMS sensor to be changed. However, such trimming methods are capable of changing the oscillation frequency only within a limited range of values, for example by a value comprised within ±20%.

It is also known to incorporate, in the electronic apparatus, a decimation circuit capable of scaling the output signal from the MEMS sensor by an integer factor, in particular in power of two. However, even this solution does not allow a high degree of personalization of the output data rate from the MEMS sensor.

BRIEF SUMMARY

In an embodiment, a sensor comprises: a digital detector, which, in operation, detects a physical quantity and generates a conditioned digital signal indicative of the detected physical quantity; and signal processing circuitry coupled to the digital detector, wherein the signal processing circuitry, in operation, generates a digital output signal of the sensor based on the conditioned digital signal and a group of parameters including an interpolation factor and a down-sampling factor. The generating the digital output signal includes: upsampling the conditioned digital signal based on the interpolation factor, generating an interpolated signal; and downsampling the interpolated signal based on the downsampling factor, generating the digital output signal.

In an embodiment, a system comprises: a sensor, which, in operation: detects a physical quantity and generates a conditioned digital signal indicative of the detected physical quantity; and generates a digital output signal of the sensor based on the conditioned digital signal and a group of parameters including an interpolation factor and a down-sampling factor, the generating the digital output signal including: upsampling the conditioned digital signal based on the interpolation factor, generating an interpolated signal; and downsampling the interpolated signal based on the downsampling factor, generating the digital output signal; and an interface, coupled to the sensor, wherein the sensor, in operation, receives the group of parameters via the interface.

In an embodiment, a method, comprises: detecting, by detection circuitry of a sensor, a physical quantity; generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including: upsampling the conditioned digital signal based on the interpolation factor, generating an interpolated signal; and downsampling the interpolated signal based on the downsampling factor, generating the digital output signal.

In an embodiment, a non-transitory computer-readable medium's contents configure a sensor to perform a method, the method, comprising: detecting, by detection circuitry of the sensor, a physical quantity; generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including: upsampling the conditioned digital signal based on the interpolation factor, generating an interpolated signal; and downsampling the interpolated signal based on the downsampling factor, generating the digital output signal.

BRIEF DESCRIPTION OF THE SEVERAL VIEWS OF THE DRAWINGS

For a better understanding of the present disclosure, an embodiment thereof is now described, purely by way of non-limiting example, with reference to the attached drawings, wherein.

Hereinafter, unless otherwise specified, reference will be made to the frequency of a discretized (digital) signal to indicate the sample frequency thereof, the data rate at which the samples of the discretized signal are provided at output by the respective block generating it.

DETAILED DESCRIPTION

Figure 1:
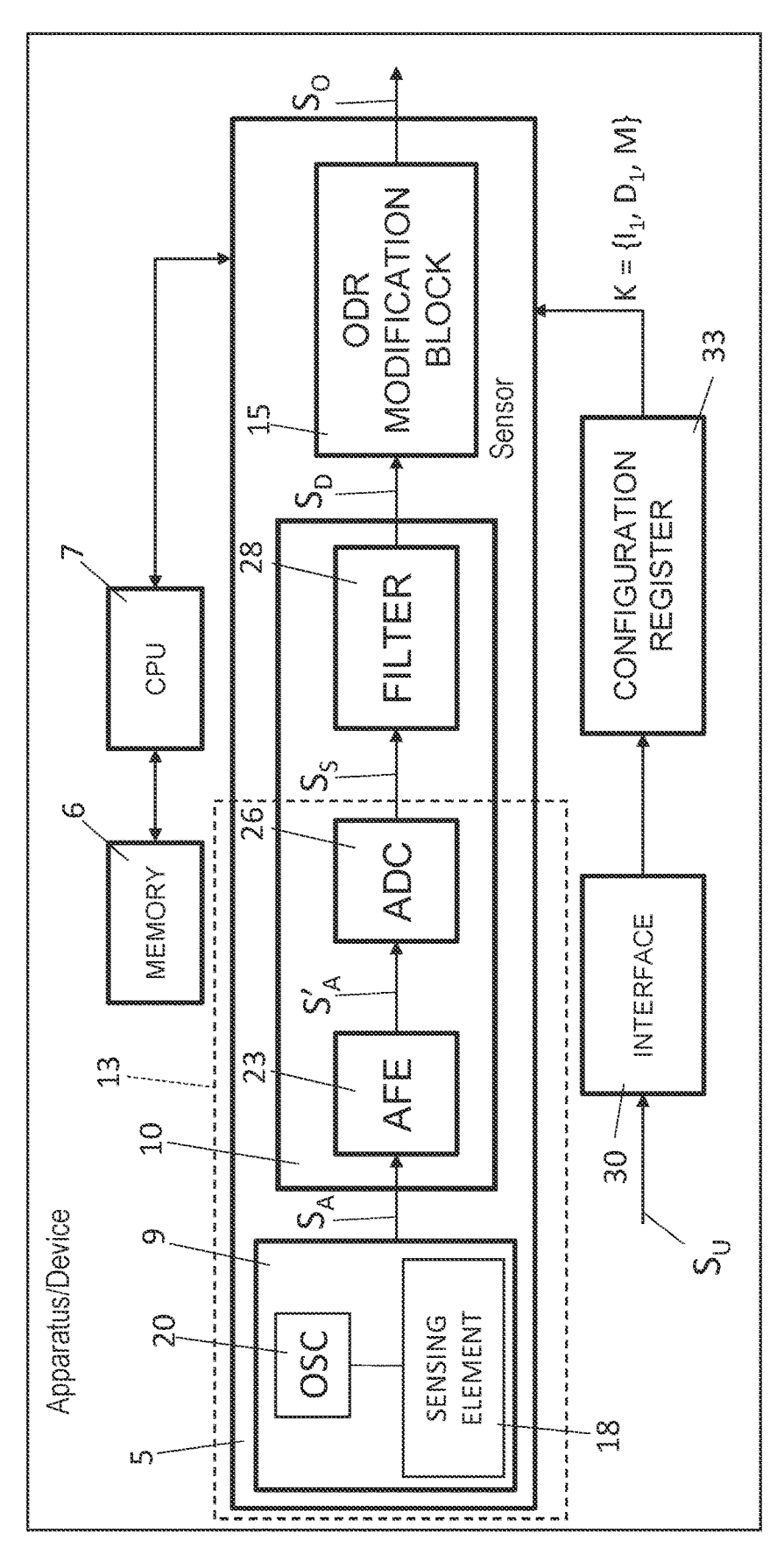
FIG. 1 shows a block diagram of an electronic apparatus comprising an embodiment of the present sensor.

FIG. 1 schematically shows an electronic apparatus 1 comprising a sensor 5, a memory 6 and a processing unit or circuit 7, operatively coupled to each other.

The sensor 5 comprises a detection unit or circuit 9, a signal conditioning stage or circuitry 10 and an output data rate (ODR) modification block or circuit 15, hereinafter also referred to as ODR modification block 15.

The sensor 5, in particular the detection unit 9, is configured to detect one or more physical quantities associated with the operation of the electronic apparatus 1 and generate one or more electrical signals, here an analog signal $S_A$, as a function of such physical quantities.

The sensor 5 may be, for example, an acceleration sensor, a temperature sensor, a pressure sensor, a mechanical stress sensor, an electrical resistance sensor, a gyroscope, etc.

In this embodiment, the sensor 5 is of MEMS type, that is the detection unit 9 is obtained using MEMS technology, and is formed in a die of semiconductor material, in particular of silicon.

In particular, in this embodiment, the detection unit 9 comprises a sensing element 18 and a mechanical oscillator 20.

The mechanical oscillator 20 comprises a movable and/or deformable structure, for example deformable in an elastic manner, such as a cantilever, a membrane or a structure having any other shape, having a resonance frequency $f_r$.

In use, the mechanical oscillator 20 is actuated, for example according to an electrostatic, piezoelectric or electromagnetic actuation principle, so that the respective movable and/or deformable structure oscillates at an operating frequency $f_o$. In general, the operating frequency $f_o$, is a function of the resonance frequency $f_r$, for example it is equal to the resonance frequency $f_r$.

The mechanical oscillator 20 is configured so that the physical quantity to be detected modifies the movement of the movable and/or deformable structure of the mechanical oscillator 20, for example modifying phase, amplitude and/or frequency thereof.

The sensing element 18 is configured to detect the movement of the movable and/or deformable structure of the mechanical oscillator 20, for example according to an electrostatic, piezoresistive, piezoelectric or electromagnetic detection principle, and convert it into the analog signal $S_A$. The trend of the analog signal $S_A$ over time is thus indicative of the movement variations of the movable and/or deformable structure of the mechanical oscillator 20 caused by the physical quantity to be detected.

The signal conditioning stage 10 is configured to receive the analog signal $S_A$ at input and provide a corresponding digital signal $S_D$, obtained by sampling the analog signal $S_A$, at output.

In detail, the signal conditioning stage 10 comprises an analog front-end (AFE) 23, an analog-to-digital converter 26 and a filter 28.

The analog front-end 23 comprises, for example, one or more operational amplifiers and is configured, for example, to filter, amplify or demodulate the analog signal $S_A$, providing a conditioned analog signal $S'_A$ at output.

The analog-to-digital converter 26 is configured to receive the conditioned analog signal $S'_A$ at input and provide a sampled signal $S_S$ at output. The sampled signal $S_S$ is obtained by discretizing the conditioned analog signal $S'_A$ at a sampling frequency $f_s$.

The sampling frequency $f_s$ is chosen during the design step on the basis of the requirements of the specific application. For example, the sampling frequency $f_s$ may be such that it complies with the Nyquist sampling theorem, greater than twice the operating frequency $f_o$ of the mechanical oscillator 20 of the detection unit 9.

The sampled signal $S_S$ output by the analog-to-digital converter 26 has therefore a sample frequency which is equal to the sampling frequency $f_s$.

The filter 28 comprises one or more filters of low-pass or band-pass type, has one or more respective cut-off frequencies and is configured to receive the sampled signal $S_S$ at input and provide the digital signal $S_D$ at output. The digital signal $S_D$ is thus obtained by filtering the sampled signal $S_S$, for example to remove unwanted spectral components thereof introduced by the analog-to-digital converter 26, by the analog front-end 23 and/or by the detection unit 9.

According to the specific application and the design requirements, for example to meet a die area occupation requirement, the filter 28 may also be configured to reduce the frequency of the sampled signal $S_S$, for example by an integer reduction factor, for example comprised between 1 and 1024.

Therefore, the digital signal $S_D$ has a conditioned sampling frequency $f'_s$, which, here, is lower than the sampling frequency $f_s$. In other applications, the conditioned sampling frequency $f'_s$ is equal to the sampling frequency $f_s$.

The ODR modification block 15 is configured to receive the digital signal $S_D$ at input and provide an output signal $S_O$ at output, having an output frequency $f_{ou}$ which is different from the conditioned sampling frequency $f'_s$ of the digital signal $S_D$.

The output signal $S_O$ is obtained from the digital signal $S_D$, modifying the sample frequency thereof, as described in detail hereinafter, on the basis of a parameters set K.

The output signal $S_O$ forms the output signal from sensor 5.

The electronic apparatus 1 also comprises an interface 30 and a configuration register 33. The interface 30 is configured to receive, from a user of the electronic apparatus 1 or from an application executing on the processor 7, a user signal $S_U$ indicative of the desired output frequency $f_{ou}$ of the output signal $S_O$ from the sensor 5.

The interface 30 is configured to convert the user signal $S_U$ into the parameters set K and store the parameters set K in the configuration register 33.

According to another embodiment, the user signal $S_U$ is converted into the parameters set K by the processing unit 7 and the interface 30 functions as a signal transfer bus between the processing unit 7 and the configuration register 33.

The parameters set K is formed by an interpolation factor $I_1$ and by a first decimation factor $D_1$.

Furthermore, in this embodiment, the parameters set K also comprises a second decimation factor M.

Figure 2:
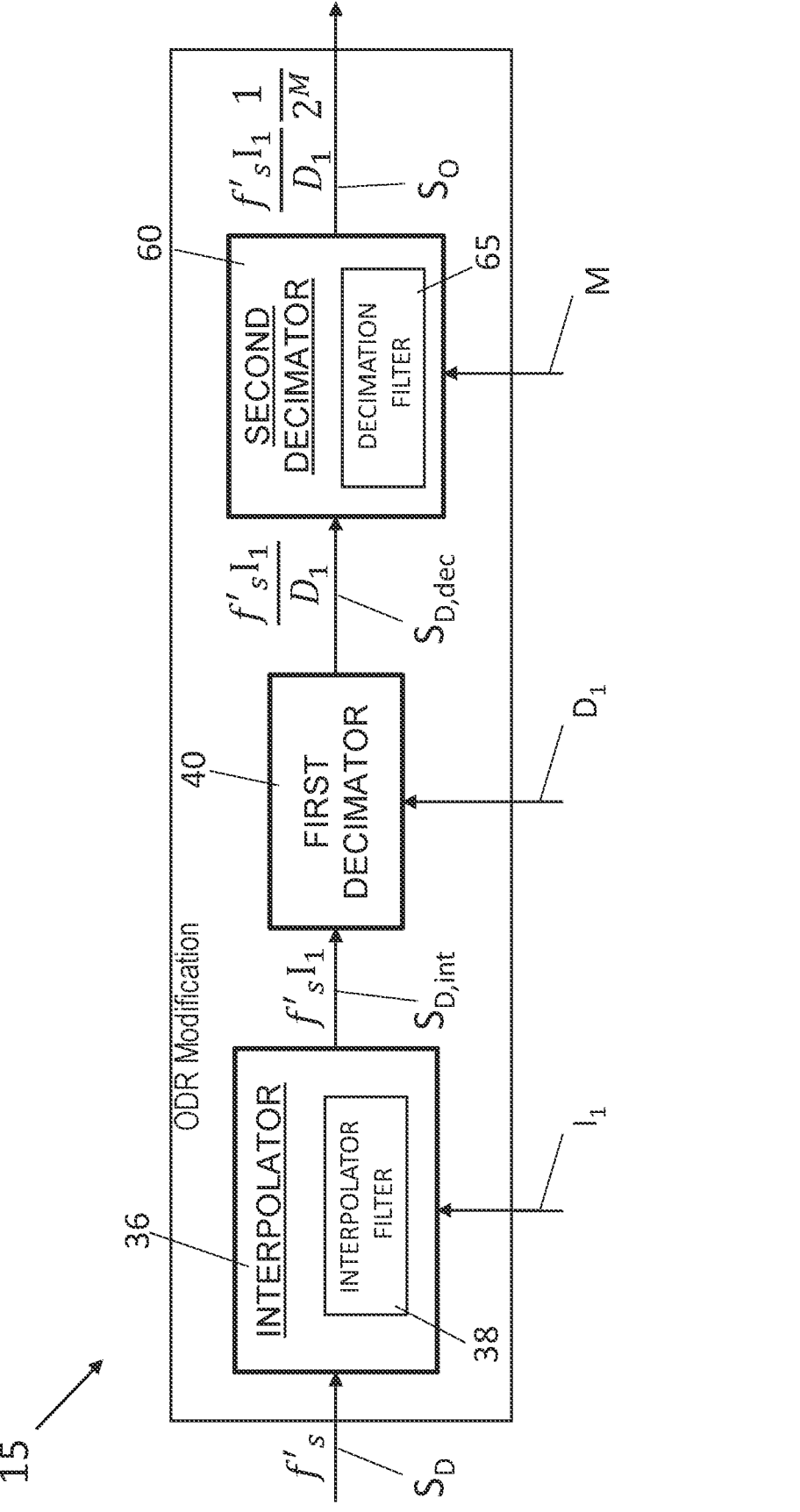
FIG. 2 shows a block diagram of an embodiment of an output data rate modification block of the electronic apparatus of FIG. 1.

As shown in FIG. 2, the ODR modification block or circuit 15 comprises an interpolation device, or interpolator, 36 and a first decimator 40.

The interpolator 36 includes an interpolation filter 38, is configured to receive the interpolation factor $I_1$ and the digital signal $S_D$ (at the conditioned sampling frequency $f'_s$) at input and is configured to provide an interpolated digital signal $S_{D,int}$ at output. The interpolated digital signal $S_{D,int}$ has an interpolation frequency $f_{int}$ that is greater than the conditioned sampling frequency $f'_s$. In particular, here, the interpolation frequency $f_{int}$ is obtained by increasing the conditioned sampling frequency $f'_s$ by the interpolation factor $I_1$.

The interpolator 36, in particular the respective interpolation filter 38, may be obtained, in a known manner, using for example a linear or non-linear phase interpolation circuit, in particular of CIC ("Cascaded Integrator-Comb"), spline, Lagrangian, Hermitian type.

The first decimator 40 is configured to receive the interpolated digital signal $S_{D,int}$ and the first decimation factor $D_1$ at input.

Figure 3:
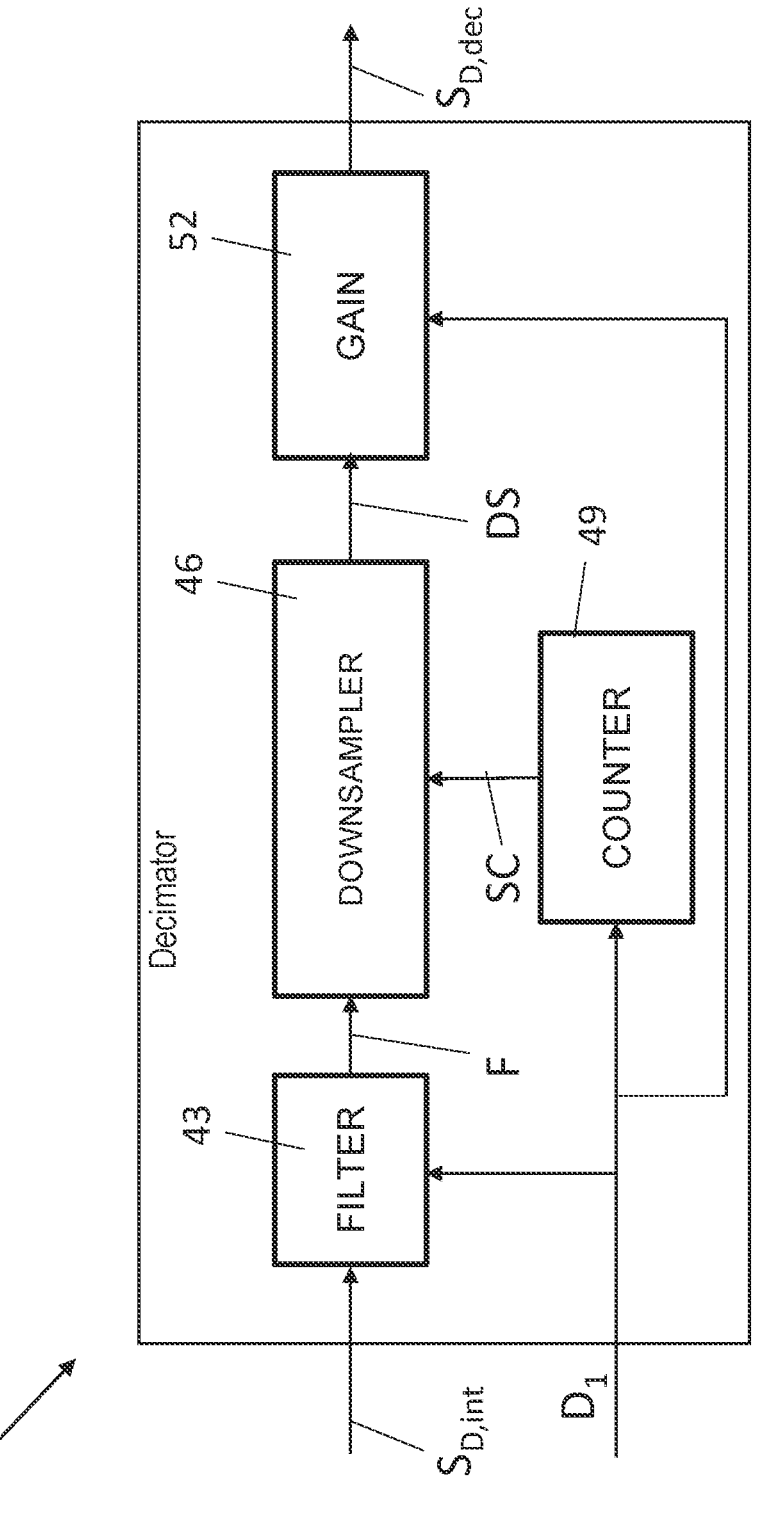
FIG. 3 shows a block diagram of an embodiment of a first decimator of the output data rate modification block of FIG. 2.

In detail, as shown in FIG. 3, the first decimator 40 comprises a filtering stage or filter 43, a downsampler 46 coupled to a counter 49, and a gain block or circuit 52.

The filtering stage 43 may be a low-pass filter, for example an infinite impulse response (IIR) or a finite impulse response (FIR) filter such as a CIC circuit, and is configured to receive the first decimation factor $D_1$ and the interpolated digital signal $S_{D,int}$ at input and provide a filtered signal F at output.

The filtering stage 43 has a respective transfer function $H(f, D_1)$ having a respective cut-off frequency $f_c$, which may be chosen on the basis of the output frequency $f_{ou}$, in particular on the basis of the first decimation factor $D_1$.

For example, the cut-off frequency $f_c$ may be chosen in such a way that the ratio between the frequency of the decimated digital signal $S_{D,dec}$ and the cut-off frequency $f_c$ complies with the Nyquist sampling theorem. Furthermore, the cut-off frequency $f_c$ may be chosen to suppress the high-frequency spectral images introduced by the interpolator 36.

The transfer function $H(f, D_1)$ of the filtering stage 43, in particular the respective cut-off frequency $f_c$, may be modified, in use, in a known manner. For example, in case the filtering stage 43 is formed by a CIC filter of order N, the relative coefficients which determine the transfer function $H(f, D_1)$ thereof may be determined, in a known manner, from the ratio between the frequency of the decimated digital signal $S_{D,dec}$ and the frequency of the interpolated digital signal $S_{D,int}$. In case the filtering stage 43 is formed by an IIR filter, the relative coefficients that determine the transfer function $H(f, D_1)$ thereof may be chosen from a specific look-up table, for example stored in the memory 6.

The counter 49 is configured to receive the first decimation factor $D_1$ at input and provide a counter command signal SC, indicative of the first decimation factor $D_1$, at output.

According to an embodiment, the sensor 5 comprises a clock configured to generate a clock signal having a respective frequency, for example of the order of megahertz, and the counter 49 is configured to receive also the clock signal at input. Furthermore, the counter 49 is configured to store a count number and to increase the count number by one unit at each cycle of the clock signal.

In this embodiment, the first decimation factor $D_1$ indicates a number of clock cycles.

Furthermore, the counter 49 is configured to compare, at each clock cycle, the count number with the first decimation factor $D_1$. If the count number is equal to the first decimation factor $D_1$, then the counter 49 generates the counter command signal SC.

The downsampler 46 is configured to receive the filtered signal F and the counter command signal SC at input and provide a downsampled signal DS at output. The downsampled signal DS is obtained from the filtered signal F. In detail, the counter command signal SC causes the downsampler 46 to provide every $D_1$-th sample of the filtered signal F at output. In other words, the sample frequency of the downsampled signal DS is lower than the filtered signal F, as described in detail hereinafter.

The gain block 52 is configured to receive the downsampled signal DS and the first decimation factor $D_1$ at input, and provide the decimated digital signal $S_{D,dec}$ at output.

In detail, the gain block 52 is configured to amplify or attenuate, by a gain factor G, the value of the samples of the downsampled signal DS corresponding to a DC component (at zero frequency) of the downsampled signal DS. For example, the zero-frequency component of the downsampled signal DS is identified by performing a Fourier transform of the downsampled signal DS. The gain factor G may be chosen as a function of the first decimation factor $D_1$ and as a function of the type of filter used in the filtering stage 43.

In particular, if the filtering stage 43 is obtained using an IIR filter, then the gain factor G may be chosen from a specific look-up table, stored in the memory 6. If the filtering stage 43 is obtained using a CIC filter, then the gain factor G may be calculated as $1/D_1^N$, wherein N is the order of the CIC filter of the filtering stage 43.

Again with reference to FIG. 2, the ODR modification block 15 further comprises a second decimator 60 including a decimation filter 65. The decimation filter 65 is configured, in a known manner, to perform a power-of-two decimation of the discretized signal received at input. In detail, the second decimator 60 is configured to receive the decimated digital signal $S_{D,dec}$ and the second decimation factor M at input and provide the output signal $S_O$ at output.

In practice, in order to generate the output signal $S_O$, the second decimator 60 downsamples the decimated digital signal $S_{D,dec}$, reducing the sample frequency thereof by a factor $2^M$. In other words, the output signal $S_O$ is obtained by providing a sample $S_{Oi}$ at output every $2^M$-th sample of the decimated digital signal $S_{D,dec}$. According to an embodiment, the second decimator 60 is also configured to filter the decimated digital signal $S_{D,dec}$, for example so that the output signal $S_O$ complies with the Nyquist sampling theorem.

In use, the sensor 5 performs a personalization of its output data rate, for example using a personalization method 100 as described hereinafter with reference to FIG. 4.

The method 100 starts when a user of the electronic apparatus 1 or an application executed by the electronic device indicates a desired output data rate $ODR_E$ from sensor 5, the desired output frequency $f_{ou}$, of the output signal $S_O$, by sending the user signal $S_U$ to the interface 30 (FIG. 1).

For example, the user signal $S_U$ may be indicative of a choice, by the user, of the desired output data rate $ODR_E$ from a list of defined values stored in the memory 6. The defined list may be predefined. A parameters set K, which is also stored in the memory 6, corresponds to each defined value of the desired output data rate $ODR_E$.

Alternatively, the user may indicate, through the user signal $S_U$, directly one or more of the parameters that form the parameters set K.

When the interface 30 receives the user signal $S_U$, it determines the parameters set K; that is, here, determines the interpolation factor $I_1$, the first decimation factor $D_1$ and the second decimation factor M, and writes them in the configuration register 33.

Purely by way of example, in this embodiment, the interpolation factor $I_1$ may be equal to 64, while the first and the second decimation factors $D_1$, M may be variable, according to the desired output data rate $ODR_E$ chosen by the user. However, the interpolation factor $I_1$ may have a different value, in particular equal to a power of two.

In particular, here, the first decimation factor $D_1$ may be comprised between 48 and 95, and the second decimation factor M may be comprised between 0 and 10.

Subsequently, step 105, the sensor 5, in particular the ODR modification block 15, receives the parameters set K and configures the respective interpolator 36, the respective first decimator 40 and the respective second decimator 60.

In detail, the interpolator 36 receives the interpolation factor $I_1$, from which it sets the coefficients of the respective interpolation filter 38, so that the interpolation filter 38 performs an interpolation equal to the interpolation factor $I_1$. The first decimator 40 receives the first decimation factor $D_1$ and consequently configures the respective filtering stage 43, the counter 49 and the gain block 52.

Furthermore, here, the second decimator 60 receives the second decimation factor M, from which it sets the coefficients of the respective decimation filter 65, so that the decimation filter 65 performs a decimation of value $2^M$, wherein M is the second decimation factor.

In use, the ODR modification block 15 receives the digital signal $S_D$ from the signal conditioning stage 10, at the conditioned sampling frequency $f'_s$. By way of example, consider for example that the conditioned sampling frequency $f'_s$ is 6.25 kHz.

When the modification block receives the digital signal $S_D$, the digital signal $S_D$ is upsampled, upsampling 110, by the interpolator 36 (FIG. 2). The interpolator 36 generates the interpolated signal $S_{D,int}$, whose sample frequency is increased by the interpolation factor $I_1$ with respect to the sample frequency of the digital signal $S_D$. The sample frequency of the interpolated digital signal $S_{D,int}$ is therefore given by the formula $f'_s \cdot I_1$, and is therefore equal, in the considered example, to 400 kHz.

The first decimator 40 receives the interpolated digital signal $S_{D,int}$ at input and downsamples (first decimation 115)

the interpolated digital signal $S_{D,int}$ by an amount indicated by the first decimation factor $D_1$. As a result, the decimated digital signal $S_{D,dec}$ has a sample frequency given by $f'_s \cdot I_1 / D_1$. For example, considering the present example wherein the first decimation factor $D_1$ is comprised in the range 48-95, and wherein the frequency of the interpolated digital signal $S_{D,int}$ is 400 kHz, the sample frequency of the decimated digital signal $S_{D,dec}$ is comprised in the range 4.21 kHz-8.33 kHz.

Figure 5:
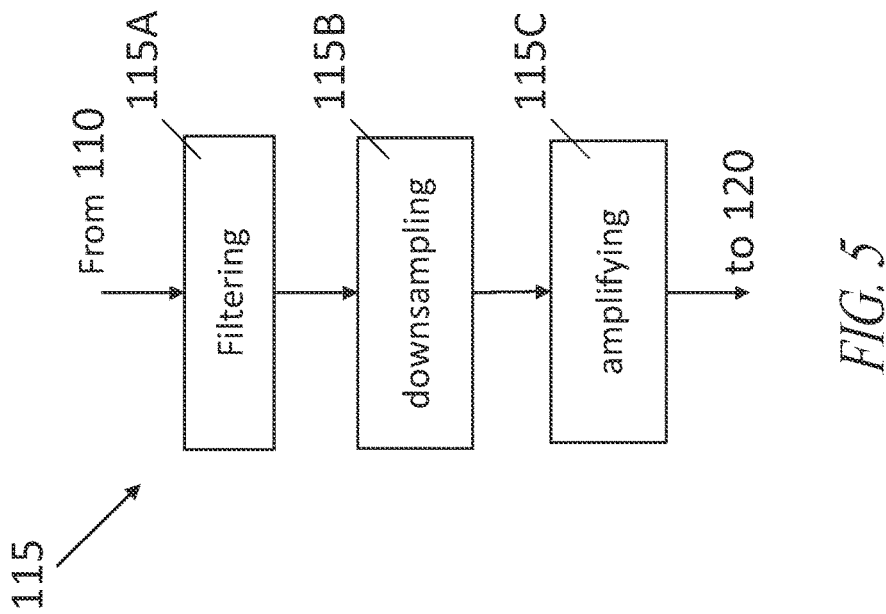
FIG. 5 shows in detail a step of the flow chart of FIG. 4 according to an embodiment.
Figure 4:
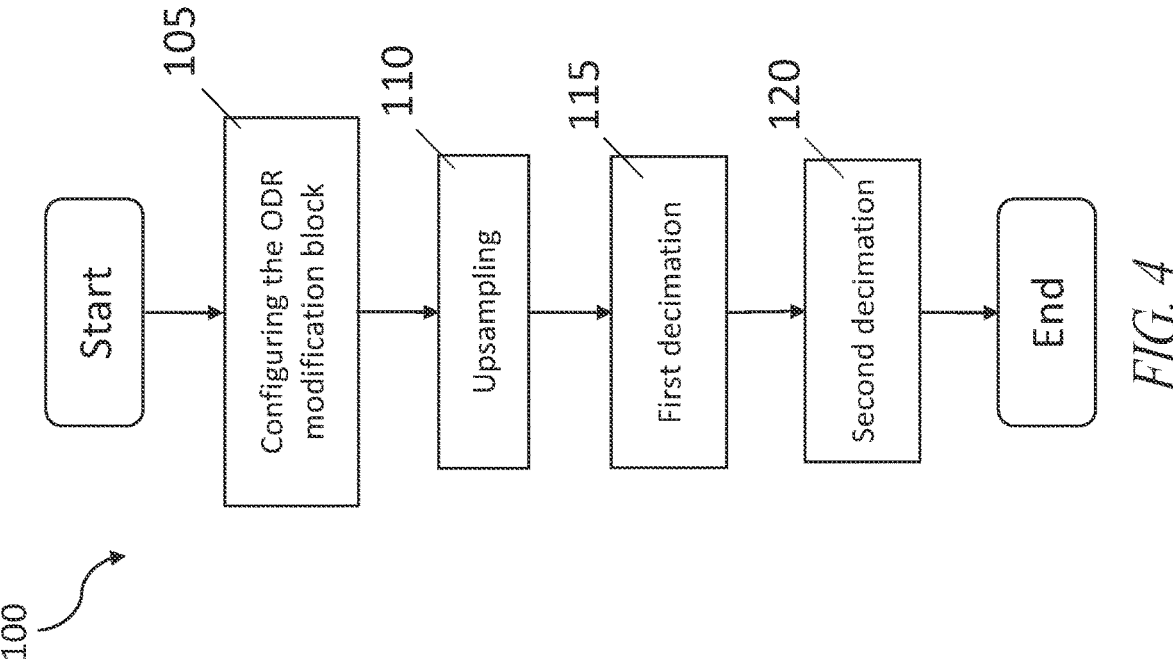
FIG. 4 shows a flow chart of a method for personalizing the output data rate according to an embodiment.

In detail, as shown in FIG. 5, the first decimation 115 of the method 100 of FIG. 4 comprises in succession filtering 115A, downsampling 115B and amplification 115C.

During filtering 115A, the filtering stage 43 of the first decimator 40 receives the interpolated digital signal $S_{D,int}$ and the interpolated digital signal $S_{D,int}$ is subject to a low-pass filtering. The filtering stage 43 thus allows high-frequency components of the interpolated digital signal $S_{D,int}$ introduced by the interpolator 36 in the upsampling 110 to be removed.

Subsequently, during downsampling 115B, the downsampler 46 receives the filtered signal F and the counter command signal SC at input and provides the downsampled signal DS, which is formed by each $D_1$-th sample of the filtered signal F, at output.

The gain block 52 receives the downsampled signal DS at input and amplifies (amplification 115C) the DC component (at zero frequency) thereof, to compensate for the attenuation caused by the filtering stage 43, as described hereinabove.

According to a different embodiment, the gain block 52 may be configured both to amplify and to attenuate the DC component of the downsampled signal DS, depending on whether the filtering stage 43 has introduced an attenuation or an amplification, respectively, in the filtered signal F.

Again with reference to FIG. 4, the decimated digital signal $S_{D,dec}$ output by the gain block 52 (and therefore by the first decimator 40) is subject to a second decimation 120. In detail, the second decimator 60 receives the decimated digital signal $S_{D,dec}$ at input and reduces the sample frequency thereof by an amount $2^M$, wherein M is the second decimation factor. In other words, the output signal $S_O$ is formed by each $2^M$-th sample of the decimated digital signal $S_{D,dec}$.

The output signal $S_O$ from the ODR modification block 15, and therefore from the sensor 5, thus obtained, may be provided to further devices, internal or external to the electronic apparatus 1 and not shown here, for a subsequent processing.

Therefore, the desired output sample rate $ODR_E$, the output frequency $f_{ou}$ of the samples of the output signal $S_O$, is overall related to the conditioned sampling frequency $f'_s$ of the digital signal $S_D$ by the formula $ODR_E = f'_s \cdot I_1 / D_1 / 2^M$.

As a result, the electronic apparatus 1 allows, using method 100, to personalize the frequency at which the sensor 5 provides at output the data relating to the physical quantity detected by the detection unit 9 (and therefore derived from the sampling of the analogue signal $S_A$).

In particular, as apparent from what has been described hereinabove, the presence of the interpolator 36 and the first decimator 40 facilitates any ratio, either integer or rational, between the output frequency $f_{ou}$ of the output signal $S_O$ and the conditioned sampling frequency $f'_s$ to be obtained.

By suitably choosing the values of the parameters set K, it is also possible to cause the output frequency $f_{ou}$ of the output signal $S_O$ to be greater than the conditioned sampling frequency $f'_s$.

As a result, the ODR modification block 15, in particular the interpolator 36 and the first decimator 40, confer high versatility to the electronic apparatus 1, while allowing it to meet the band and sampling requirements of a specific application. In fact, the ODR modification block 15 is arranged in cascade to the signal conditioning stage 10, which is designed to cause the digital signal $S_D$ to meet such requirements of the specific application. For example, the sampling frequency $f_s$ of the analog-to-digital converter 26 and the cut-off frequency of the filter 28 are chosen as a function of the band of the analog signal $S_A$ and/or the operating frequency $f_o$ of the mechanical oscillator 20.

Additionally, the second decimator 60 confers a further degree of freedom in modifying the output frequency $f_{out}$.

The electronic apparatus 1 may therefore be used in multiple applications, which require different values of output data rate from the sensor 5, for example comprised between 1 Hz and 10 kHz.

Furthermore, the ODR modification block 15 also allows a variation in the output data rate of the sensor 5 from a respective design nominal value to be compensated for.

The variation in the output data rate may in fact be caused by possible deviations of the resonance frequency $f_r$ of the mechanical oscillator 20 from a respective design nominal value.

For example, the variation in the output data rate of the sensor 5 may be caused by variabilities of the manufacturing process of the detection unit 9 of the sensor 5. In this case, a deviation of the resonance frequency $f_r$ from the respective design nominal value would also lead to a variation in the operating frequency $f_o$. As a result, also the sampling frequency $f_s$, which is chosen as a function of the operating frequency $f_o$, would be subject to a variation which in turn, in the absence of the ODR modification block 15, would cause a deviation of the output data rate of the sensor from the respective design nominal value.

The variation of the output data rate may also be caused by possible deviations of the oscillation frequency of an electronic oscillator, for example a clock, of the sensor 5 with respect to a design nominal value.

Therefore, the present sensor allows deviations of the output data rate from the sensor itself to be corrected, with respect to the desired nominal value.

Furthermore, the fact that the gain block 52 is arranged in cascade to the downsampler 46, and therefore the amplification 115C of FIG. 5 of the first decimator 40 is performed after the respective downsampling 115B of FIG. 5, allows the sensor 5, and therefore the electronic apparatus 1, to have a low energy consumption. In fact, the gain block 52 is configured to operate at the sample frequency of the downsampled signal DS, which is lower, for example, than the sample frequency of the filtered signal F output by the filtering stage 43. Vice versa, for example, if the amplification 115C was carried out before the downsampling 115B, the gain block 52 should be configured to operate at the frequency of the filtered signal F (which is higher than the frequency of the downsampled signal DS), and therefore would entail a greater energy consumption of the sensor 5, and therefore of the electronic apparatus 1.

Finally, it is clear that modifications and variations may be made to the present sensor, the present electronic apparatus and the present method for personalizing the output data rate described and illustrated herein without thereby departing from the protective scope of the present disclosure, as defined in the attached claims.

For example, the steps of the method 100 of FIGS. 4 and 5 may be obtained both by using a hardware solution, through dedicated circuits, and by using a software solution, through dedicated computer programs.

For example, the sensor 5 may be formed in a single die or in multiple dice of semiconductor material. In particular, the detection unit 9 may be formed in a first die and the signal conditioning stage 10 and the ODR modification block 15 may be formed in a second die. Alternatively, the analog circuits, here the analog front-end 23, and the digital circuits, here the analog-to-digital converter 26, the filter 28 and the ODR modification block 15, may be formed on two different dies.

In general, however, in the sensor 5, the detection unit 9, the analog front-end 23 and the analog-to-digital converter 26 may be considered functionally as forming a digital detector 13, which is represented by a dashed block in FIG. 1. In some applications, also the filter 28 may be considered as belonging to the digital detector 13.

A sensor (5) configured to provide a digital output signal (SO), the sensor may be summarized as including a digital detector (13), configured to detect a physical quantity and generate a conditioned digital signal (SD) indicative of the detected physical quantity; and a rate modification stage (15), configured to receive the conditioned digital signal and a group of parameters (K), the group of parameters comprising an interpolation factor (I1) and a downsampling factor (D1, M), and to provide the digital output signal, wherein the rate modification stage comprises an interpolator (36) and a decimation element (40, 60), the interpolator being configured to receive and upsample the conditioned digital signal based on the interpolation factor and to provide an interpolated signal (SD,int), and the decimation element being configured to downsample the interpolated signal based on the downsampling factor, thereby generating the digital output signal.

The sensor may be a MEMS sensor.

The digital detector (13) may include a detection unit (9) configured to detect the physical quantity and generate an analog signal (SA) indicative of the detected physical quantity, and a conditioning stage (10) configured to receive and discretize the analog signal (SA), thus generating the conditioned digital signal (SD).

The detection unit (9) may include a mechanical oscillator (20) and a sensing element (18), the mechanical oscillator being configured to be actuated at an operating frequency (fo) and to oscillate at an oscillation frequency depending on the operating frequency and on the physical quantity to be detected, and the sensing element being configured to convert the oscillations of the mechanical oscillator into the analog signal (SA).

The decimation element may include a first decimator (40) including a filtering stage (43), a downsampling stage (46, 49) and a gain stage (52); the filtering stage (43) including a low-pass filter having a respective cut-off frequency (fc) and being configured to receive the interpolated signal (SD,int) and generate a filtered signal (F); the downsampling stage (46, 49) being configured to downsample the filtered signal using a first decimation factor (D1) and to generate a downsampled signal (DS) having a DC component; and the gain stage (52) being configured to amplify or attenuate the DC component of the downsampled signal by a gain value (G).

The cut-off frequency of the filtering stage (43) and the gain value of the gain stage (52) may be a function of the first decimation factor (D1).

The decimation element may include a first decimator (40) configured to receive the interpolated signal (SD,int) and downsample the interpolated signal using a first decimation factor (D1), thereby generating a decimated signal (SD,dec); and the decimation element may include a second decimator (60) configured to receive the decimated signal (SD,dec) and to carry out a power-of-two downsampling of the decimated signal by a value $2^M$, wherein M is a second decimation factor.

The conditioning stage (10) may include an analog front-end (23) configured to receive the analog signal (SA) and having an output, an analog-to-digital converter (26), coupled to the output of the analog front-end and configured to provide a sampled signal (SS), and a filter (28), configured to receive and filter the sampled signal, thereby generating the conditioned digital signal (SD).

An electronic apparatus may be summarized as including the sensor and may further include an interface device (7, 30, 33), the interface device being configured to send the group of parameters (K) to the rate modification block (15) of the sensor.

A method for personalizing a sample rate of a digital output signal (SO) from a sensor (5) including a rate modification stage (15) receiving a conditioned digital signal (SD), related to a detected physical quantity, the rate modification stage including an interpolator (36) and a decimation element (40, 60), the method may be summarized as including receiving, by the rate modification stage (15), a group of parameters (K) including an interpolation factor (I1) and a downsampling factor (D1, M); upsampling the conditioned digital signal using the interpolation factor, thus obtaining an interpolated signal (SD,int); and downsampling the interpolated signal (SD,int) using the downsampling factor, thus obtaining the digital output signal (SO).

The sensor may be a MEMS sensor comprising a detection unit (9) including a mechanical oscillator (20), the mechanical oscillator being configured to be actuated at an operating frequency (fo), the conditioned digital signal having a conditioned sample rate (f's) which is a function of the operating frequency of the mechanical oscillator.

Downsampling the interpolated signal (SD,int) using the downsampling factor may include filtering (115A) the interpolated signal provided by the interpolator (36) by a low-pass filter (43) having a cut-off frequency (fc), thus obtaining a filtered signal (F); downsampling (115B) the filtered signal using a first decimation factor (D1), thus obtaining a downsampled signal (DS) having a DC component; and modifying (115C) the DC component of the downsampled signal by amplifying or attenuating the DC component, using a gain value.

The cut-off frequency and the gain value may be a function of the first decimation factor (D1).

The decimation element may include a first decimator (40) and a second decimator (60), and wherein downsampling the interpolated signal may include downsampling, by the first decimator (40), the interpolated signal using a first decimation factor, thereby obtaining a decimated signal (SD,dec); and power-of-two downsampling, by the second decimator (60), the decimated signal by a value $2^M$, wherein M is a second decimation factor, thereby obtaining the digital output signal (SO).

In an embodiment, a sensor comprises: a digital detector, which, in operation, detects a physical quantity and generates a conditioned digital signal indicative of the detected physical quantity; and signal processing circuitry coupled to the digital detector, wherein the signal processing circuitry, in operation, generates a digital output signal of the sensor based on the conditioned digital signal and a group of parameters including an interpolation factor and a downsampling factor. The generating the digital output signal includes: upsampling the conditioned digital signal based on the interpolation factor, generating an interpolated signal; and downsampling the interpolated signal based on the downsampling factor, generating the digital output signal. In an embodiment, the signal processing circuitry comprises: an interpolator coupled to the digital detector, wherein the interpolator, in operation upsamples the conditioned digital signal based on the interpolation factor, generating the interpolated signal; and decimation circuitry, coupled to the interpolator, wherein the decimation circuitry, in operation, downsamples the interpolated signal based on the downsampling factor. In an embodiment, the sensor is a MEMS sensor. In an embodiment, the digital detector comprises: detection circuitry, which, in operation, detects the physical quantity and generates an analog signal indicative of the detected physical quantity; and conditioning circuitry, coupled to the detection circuitry, wherein the conditioning circuitry, in operation, digitizes the analog signal, generating the conditioned digital signal. In an embodiment, the detection circuitry comprises a mechanical oscillator and a sensing element coupled to the mechanical oscillator, the mechanical oscillator being configured to be actuated at an operating frequency and to oscillate at an oscillation frequency depending on the operating frequency and on the physical quantity to be detected, and the sensing element being configured to convert the oscillations of the mechanical oscillator into the analog signal. In an embodiment, the decimation circuitry comprises a first decimator including: a low-pass filter having a cut-off frequency, wherein the low-pass filter, in operation, generates a filtered signal based on the interpolated signal; a downsampler coupled to the low-pass filter, wherein the downsampler, in operation, downsamples the filtered signal using a first decimation factor, generating a downsampled signal having a direct current component; and gain circuitry, coupled to the downsampler, wherein the gain circuitry, in operation, applies a gain to amplify or attenuate the DC component of the downsampled signal. In an embodiment, the cut-off frequency of the filter and the gain of the gain circuitry are a function of the first decimation factor. In an embodiment, the decimation circuitry comprises a first decimator configured to receive the interpolated signal and downsample the interpolated signal using a first decimation factor, generating a decimated signal; and the decimation circuitry comprises a second decimator configured to receive the decimated signal and to apply a power-of-two downsampling of the decimated signal by a value $2^M$, wherein M is a second decimation factor. In an embodiment, the conditioning circuitry comprises an analog front-end configured to receive the analog signal and having an output, an analog-to-digital converter, coupled to the output of the analog front-end and configured to provide a sampled signal, and a filter, configured to filter the sampled signal, generating the conditioned digital signal. In an embodiment, the sensor comprises an input, which, in operation, receives the group of parameters.

In an embodiment, a system comprises: a sensor, which, in operation: detects a physical quantity and generates a conditioned digital signal indicative of the detected physical quantity; and generates a digital output signal of the sensor based on the conditioned digital signal and a group of parameters including an interpolation factor and a downsampling factor, the generating the digital output signal including: upsampling the conditioned digital signal based on the interpolation factor, generating an interpolated signal; and downsampling the interpolated signal based on the downsampling factor, generating the digital output signal; and an interface, coupled to the sensor, wherein the sensor, in operation, receives the group of parameters via the interface. In an embodiment, the system comprises a configuration register, wherein the interface stores the group of parameters in the configuration interface. In an embodiment, the system comprises an application processor, coupled to the interface, wherein the application processor, in operation, executes an application which generates the group of parameters.

In an embodiment, a method, comprises: detecting, by detection circuitry of a sensor, a physical quantity; generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including: upsampling the conditioned digital signal based on the interpolation factor, generating an interpolated signal; and downsampling the interpolated signal based on the downsampling factor, generating the digital output signal. In an embodiment, the method comprises: receiving, by the signal processing circuitry of the sensor, the group of parameters. In an embodiment, the sensor is a MEMS sensor comprising a detector including a mechanical oscillator, the mechanical oscillator being configured to be actuated at an operating frequency, the conditioned digital signal having a conditioned sample rate which is a function of the operating frequency of the mechanical oscillator. In an embodiment, downsampling the interpolated signal based on the downsampling factor comprises: filtering the interpolated signal using a low-pass filter having a cut-off frequency, obtaining a filtered signal; downsampling the filtered signal using a first decimation factor, obtaining a downsampled signal having a DC component; and amplifying or attenuating the DC component, using a gain value. In an embodiment, the cut-off frequency and the gain value are functions of the first decimation factor. In an embodiment, downsampling the interpolated signal comprises: downsampling, using a first decimator, the interpolated signal using a first decimation factor, obtaining a decimated signal; and power-of-two downsampling, using a second decimator, the decimated signal by a value $2^M$, wherein M is a second decimation factor, obtaining the digital output signal.

In an embodiment, a non-transitory computer-readable medium's contents configure a sensor to perform a method, the method, comprising: detecting, by detection circuitry of the sensor, a physical quantity; generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including: upsampling the conditioned digital signal based on the interpolation factor, generating an interpolated signal; and downsampling the interpolated signal based on the downsampling factor, generating the digital output signal. In an embodiment, the contents comprise instructions executed by the signal processing circuitry of the sensor. In an embodiment, the method comprises receiving the group of parameters via an interface coupled to the signal processing circuitry.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor, comprising:
a digital detector, which, in operation, detects a physical quantity and generates a conditioned digital signal indicative of the detected physical quantity; and
signal processing circuitry coupled to the digital detector, wherein the signal processing circuitry, in operation, generates a digital output signal of the sensor based on the conditioned digital signal and a group of parameters including an interpolation factor and a downsampling factor, the generating the digital output signal including:
upsampling the conditioned digital signal based on the interpolation factor, generating an interpolated signal; and
downsampling the interpolated signal based on the downsampling factor, generating the digital output signal, wherein the signal processing circuitry comprises decimation circuitry including a first decimator, wherein the first decimator, in operation, downsamples the interpolated signal based on the downsampling factor, the first decimator including:
a low-pass filter having a cut-off frequency, wherein the low-pass filter, in operation, generates a filtered signal based on the interpolated signal;
a downsampler coupled to the low-pass filter, wherein the downsampler, in operation, downsamples the filtered signal using a first decimation factor, generating a downsampled signal having a direct current (DC) component; and

gain circuitry, coupled to the downsampler, wherein the gain circuitry, in operation, applies a gain to amplify or attenuate the DC component of the downsampled signal.

2. The sensor according to claim 1, wherein the signal processing circuitry comprises:

an interpolator coupled to the digital detector and to the decimation circuitry, wherein the interpolator, in operation upsamples the conditioned digital signal based on the interpolation factor, generating the interpolated signal.

3. The sensor according to claim 1, wherein the sensor is a MEMS sensor.

4. The sensor according to claim 1, wherein the digital detector comprises:

detection circuitry, which, in operation, detects the physical quantity and generates an analog signal indicative of the detected physical quantity; and conditioning circuitry, coupled to the detection circuitry, wherein the conditioning circuitry, in operation, digitizes the analog signal, generating the conditioned digital signal.

5. The sensor according to claim 4, wherein the detection circuitry comprises a mechanical oscillator and a sensing element coupled to the mechanical oscillator, the mechanical oscillator being configured to be actuated at an operating frequency and to oscillate at an oscillation frequency depending on the operating frequency and on the physical quantity to be detected, and the sensing element being configured to convert the oscillations of the mechanical oscillator into the analog signal.

6. The sensor according to claim 4, wherein the conditioning circuitry comprises an analog front-end configured to receive the analog signal and having an output, an analog-to-digital converter, coupled to the output of the analog front-end and configured to provide a sampled signal, and a filter, configured to filter the sampled signal, generating the conditioned digital signal.

7. The sensor according to claim 1, wherein the cut-off frequency of the filter and the gain of the gain circuitry are a function of the first decimation factor.

8. The sensor according to claim 1, wherein:

the first decimator, in operation, generates a decimated signal; and the decimation circuitry comprises a second decimator, which, in operation, receives the decimated signal and applies a power-of-two downsampling of the decimated signal by a value $2^M$, wherein M is a second decimation factor.

9. The sensor of claim 1, comprising an input, which, in operation, receives the group of parameters.

10. A system, comprising:

a sensor, which, in operation:

detects a physical quantity and generates a conditioned digital signal indicative of the detected physical quantity; and generates a digital output signal of the sensor based on the conditioned digital signal and a group of parameters including an interpolation factor and a downsampling factor, the generating the digital output signal including:

upsampling the conditioned digital signal based on the interpolation factor, generating an interpolated signal; and downsampling the interpolated signal based on the downsampling factor, generating the digital output signal; and an interface, coupled to the sensor, wherein the sensor, in operation, receives the group of parameters via the interface, wherein the sensor comprises a first decimator including:

a low-pass filter having a cut-off frequency, wherein the low-pass filter, in operation, generates a filtered signal based on the interpolated signal;

a downsampler coupled to the low-pass filter, wherein the downsampler, in operation, downsamples the filtered signal using a first decimation factor, generating a downsampled signal having a direct current (DC) component; and gain circuitry, coupled to the downsampler, wherein the gain circuitry, in operation, applies a gain to amplify or attenuate the DC component of the downsampled signal.

11. The system of claim 10, comprising a configuration register, wherein the interface stores the group of parameters in the configuration interface.

12. The system of claim 11, comprising an application processor, coupled to the interface, wherein the application processor, in operation, executes an application which generates the group of parameters.

13. The system of claim 10, comprising:

a processor coupled to the interface, wherein, the interface, in operation, transmits the digital output signal to the processor, and the processor, in operation, generates a control signal based on the digital output signal.

14. The system of claim 13, wherein the processor, in operation, generates an automotive control signal based on the digital output signal.

15. A method, comprising:

detecting, by detection circuitry of a sensor, a physical quantity;

generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including:

upsampling the conditioned digital signal based on the interpolation factor, generating an interpolated signal; and downsampling the interpolated signal based on the downsampling factor, generating the digital output signal, wherein downsampling the interpolated signal based on the downsampling factor comprises:

filtering the interpolated signal using a low-pass filter having a cut-off frequency, obtaining a filtered signal;

downsampling the filtered signal using a first decimation factor, obtaining a downsampled signal having a direct current (DC) component; and amplifying or attenuating the DC component, using a gain value.

16. The method of claim 15, comprising:

receiving, by the signal processing circuitry of the sensor, the group of parameters.

17. The method according to claim 15, wherein the sensor is a MEMS sensor comprising a detector including a mechanical oscillator, the mechanical oscillator being configured to be actuated at an operating frequency, the conditioned digital signal having a conditioned sample rate which is a function of the operating frequency of the mechanical oscillator.

18. The method according to claim 15, wherein the cut-off frequency and the gain value are functions of the first decimation factor.

19. The method according to claim 15, wherein downsampling the interpolated signal comprises:

downsampling, using a first decimator, the interpolated signal using a first decimation factor, obtaining a decimated signal; and power-of-two downsampling, using a second decimator, the decimated signal by a value $2^M$, wherein M is a second decimation factor, obtaining the digital output signal.

20. A non-transitory computer-readable medium having contents which configure a sensor to perform a method, the method, comprising:

detecting, by detection circuitry of the sensor, a physical quantity;

generating, by the detection circuitry of the sensor, a conditioned digital signal indicative of the detected physical quantity; and generating, by signal processing circuitry of the sensor, a digital output signal of the sensor based on the conditioned digital signal and a group of parameters including an interpolation factor and a downsampling factor, the generating the digital output signal including:

upsampling the conditioned digital signal based on the interpolation factor, generating an interpolated signal; and downsampling the interpolated signal based on the downsampling factor, generating the digital output signal, wherein downsampling the interpolated signal based on the downsampling factor comprises:

filtering the interpolated signal using a low-pass filter having a cut-off frequency, obtaining a filtered signal;

downsampling the filtered signal using a first decimation factor, obtaining a downsampled signal having a direct current (DC) component; and amplifying or attenuating the DC component, using a gain value.

21. The non-transitory computer-readable medium of claim 20, wherein the contents comprise instructions executed by the signal processing circuitry of the sensor.

22. The non-transitory computer-readable medium of claim 20, wherein the method comprises receiving the group of parameters via an interface coupled to the signal processing circuitry.

\* \* \* \* \*